(12) United States Patent
Takao et al.

(10) Patent No.: US 8,638,134 B2
(45) Date of Patent: Jan. 28, 2014

(54) GATE DRIVE CIRCUIT AND POWER SEMICONDUCTOR MODULE

(75) Inventors: Kazuto Takao, Ibaraki (JP); Masamu Kamaga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/222,510

(22) Filed: Aug. 31, 2011

(65) Prior Publication Data
US 2012/0229200 A1 Sep. 13, 2012

(30) Foreign Application Priority Data
Mar. 10, 2011 (JP) ................................. 2011-052784

(51) Int. Cl.
*H03K 3/00* (2006.01)
(52) U.S. Cl.
USPC .......................................................... 327/109
(58) Field of Classification Search
None
See application file for complete search history.

(56) References Cited

U.S. PATENT DOCUMENTS

| | | | |
|---|---|---|---|
| 4,492,883 A | 1/1985 | Janutka | |
| 6,147,887 A * | 11/2000 | Miettinen | 363/98 |
| 6,518,791 B2 | 2/2003 | Kojima et al. | |
| 7,236,041 B2 * | 6/2007 | Kim et al. | 327/434 |
| 8,054,110 B2 * | 11/2011 | Wang et al. | 327/109 |
| 8,063,671 B2 * | 11/2011 | Xiao | 327/109 |
| 2001/0024375 A1 | 9/2001 | Kojima et al. | |
| 2004/0145922 A1 * | 7/2004 | Jutras et al. | 363/18 |
| 2010/0091526 A1 * | 4/2010 | Schlecht | 363/25 |

FOREIGN PATENT DOCUMENTS

| | | |
|---|---|---|
| JP | 4-170812 | 6/1992 |
| JP | 5-31359 | 4/1993 |
| JP | 2002-43914 | 2/2002 |
| JP | 2009-290287 | 12/2009 |

OTHER PUBLICATIONS

Japanese Office Action issued Oct. 9, 2012 in corresponding Japanese Application No. 2011-052784 (with an English Translation).
Office Action mailed Nov. 19, 2013, in Japanese Patent Application No. 2012-269296 (with English Translation).

* cited by examiner

*Primary Examiner* — Lincoln Donovan
*Assistant Examiner* — Khareem E Almo
(74) *Attorney, Agent, or Firm* — Oblon, Spivak, McClelland, Maier & Neustadt, L.L.P.

(57) ABSTRACT

A gate drive circuit capable of operating at high speed and with low loss without erroneously operating the switching element is provided with a small number of components and a simple and easy circuit configuration. A primary side of a transformer is connected to an output terminal of a low-side gate drive circuit, and a secondary side of the transformer is connected to a gate input side of a high-side switching element. As a positive gate drive voltage is output from the low-side drive circuit, a negative voltage is applied between the gate and source of a high-side switching element, and a gate voltage is suppressed to be equal to or lower than a threshold value. Therefore, the high-side switching element maintains a turn-off state when the low-side switching element is turned on.

9 Claims, 6 Drawing Sheets

GATE DRIVE CIRCUIT AND POWER SEMICONDUCTOR MODULE

CROSS-REFERENCE TO RELATED APPLICATION

This application is based upon and claims the benefit of priority from the prior Japanese Patent applications No. 2011-052784, filed on Mar. 10, 2011; the entire contents of which are incorporated herein by reference.

FIELD

Embodiments described herein relate to a gate drive circuit of a voltage-controlled switching element and a power semiconductor module.

BACKGROUND

Electrical vehicles or photovoltaic power generation systems use an electric power conversion apparatus represented by an inverter. In order to improve efficiency of the entire system, it is necessary to reduce the power loss through the electric power conversion apparatus.

Since about 50% of the loss through the electric power conversion apparatus is generated in the semiconductor switching element, reduction in power loss through the semiconductor switching element is an important technology.

Recently, an insulated gate bipolar transistor (IGBT) or a metal oxide semiconductor field effect transistor (MOSFET) which is a voltage-controlled transistor is widely used as the semiconductor switching element in the electric power conversion apparatus.

Such a switching element is turned on when a voltage of about +15 V is applied between the gate and source (or gate and emitter) from the gate drive circuit so that the gate-to-source (or gate-to-emitter) voltage exceeds a threshold value, and the current flows between the drain and the source (or the collector and emitter).

In order to turn off the switching element, the gate-to-source (or gate-to-emitter) voltage is maintained to be equal to or lower than a threshold value by setting the output voltage of the gate drive circuit to about 0 V or −15 V.

Gate electrodes of the MOSFET and the IGBT are covered by an oxide film. A gate-source capacitance (or gate-emitter capacitance) is formed between the gate electrode and the source electrode (or emitter electrode), and a gate-drain capacitance (or gate-collector capacitance) is formed between the gate electrode and the drain electrode (or collector electrode).

Therefore, an equivalent circuit in the vicinity of the gate of the switching element includes a parallel connection between the gate-source capacitance (or gate-emitter capacitance) and the gate-drain capacitance (or gate-collector capacitance).

Typically, a gate resistance is connected between the gate electrode of the switching element and the gate drive circuit. Therefore, if a voltage of about +15 V is applied from the gate drive circuit to turn on the switching element, the gate-source capacitance (or gate-emitter capacitance) and the gate-drain capacitance (or gate-collector capacitance) are charged through the gate resistance.

In a standard hard-switching circuit, the values of the gate circuit is changed for the purpose of changing the charge time for the aforementioned capacitances, thereby adjusting the switching time of the switching element.

The switching loss can be reduced by shortening the switching time. Therefore, in order to realize the low loss in the switching element, there is proposed a method of reducing the switching time by reducing the value of gate resistance.

Figure 1:
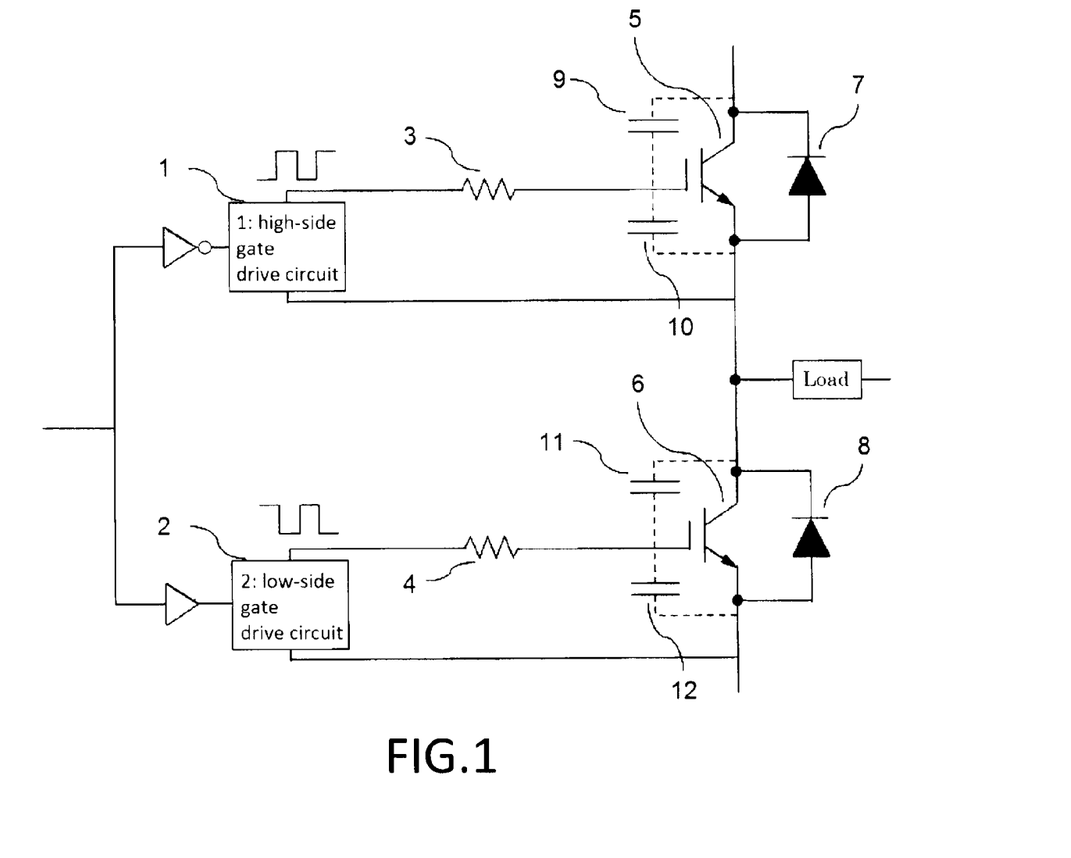
FIG. 1 is an equivalent circuit diagram illustrating a single leg in an inverter circuit of the related art.

In an inverter circuit shown in FIG. 1, switching elements are provided in both high and low sides to constitute an upper arm and a lower arm, and they are controlled such that, when any one of both sides is turned on, the other side is turned off. For example, the switching element in the low side is turned off when the switching element in the high side is turned on. Conversely, the switching element in the low side is turned on when the switching element in the high side is turned off. If the switching elements in both sides are turned on at the same time, a short-circuit current equal to or higher than a rated current of the switching element flows through the upper and lower arms so that the switching element may break down. Therefore, a period of time (dead time) during which both elements are in OFF state at the same time is provided so that not both elements are in ON state at the same time.

Figure 2:
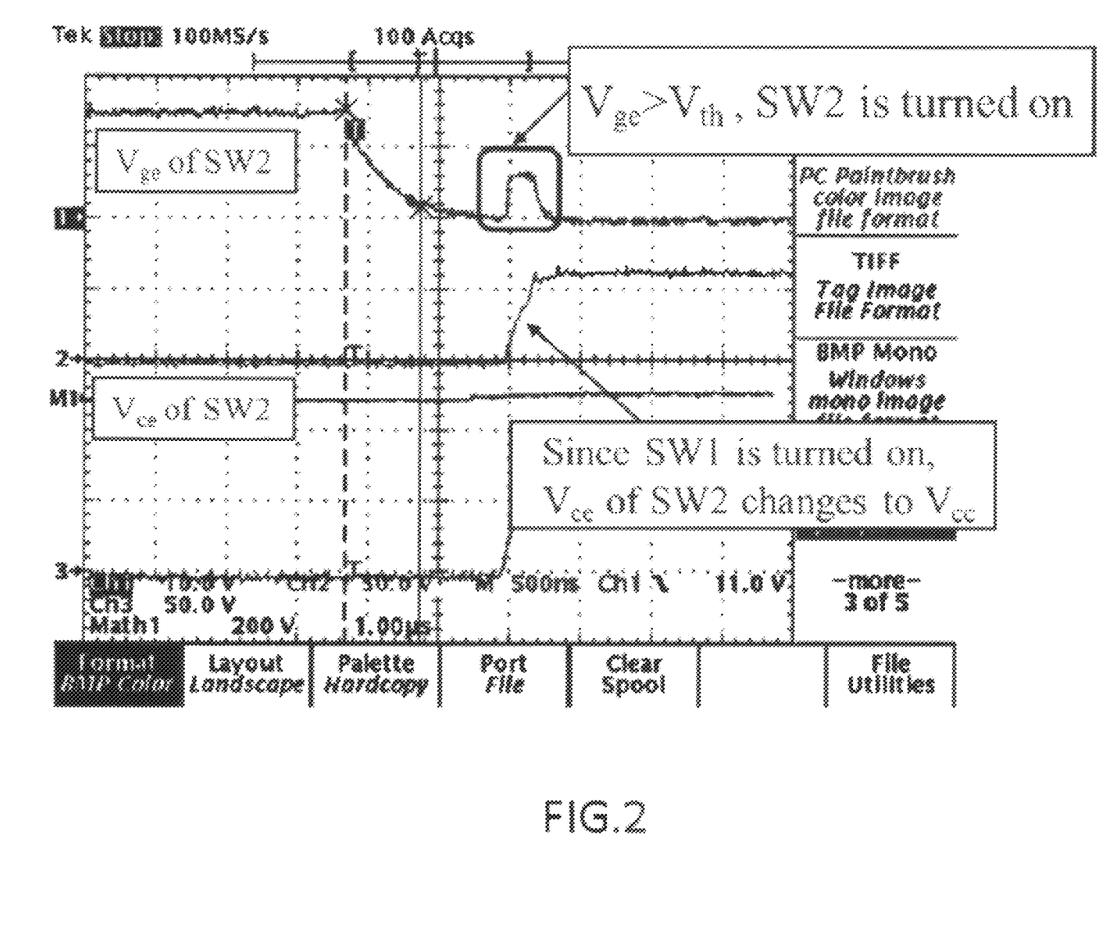
FIG. 2 is a waveform diagram illustrating a gate voltage generated between a gate and a source of the switching element in the inverter circuit of the related art.

Here, as shown in FIG. 2, if one of the switching elements is turned on from the turn-off state, a drain-to-source voltage (or a collector-to-emitter voltage) of the other switching element automatically changes from 0 V to an input DC voltage. At the same time, the gate-drain capacitance (gate-collector capacitance) is charged to a value approximately equal to the input DC voltage.

In this case, a displacement current may flow through the gate-drain (or gate-collector) capacitance to charge the gate-source (or gate-emitter) capacitance so that the gate voltage exceeds a threshold value, and the switching element may be erroneously turned on.

The peak value of the displacement current is proportional to the time variation rate (dV/dt) of the drain-to-source (or collector-to-emitter) voltage of the switching element. Therefore, if the switching time is reduced to reduce switching loss of the switching element, the peak value of the displacement current increases so that the switching element is easily turned on due to the principle described above.

In this regard, there has been a study on a gate drive circuit for preventing the gate voltage from exceeding a threshold value by short-circuiting the semiconductor switching element between the gate and the source (or between the gate and the emitter).

However, in such a circuit, it is necessary to further prepare elements including two diodes, a single resistor, a switching element, and the like in addition to the components in the typical gate drive circuit. Further, since it is necessary to operate the aforementioned switching element in synchronization with a control signal of a typical gate drive circuit, a control device for generating a synchronization signal is also necessary. This makes the design of the entire circuit complicated.

DETAILED DESCRIPTION

The embodiments are for addressing above mentioned problems, and provide a gate drive circuit capable of operating at a high speed with low loss without erroneously operating the switching element using a simple circuit configuration with a small number of components.

According to a first aspect, there is provided a gate drive circuit, in which a primary side of a transformer is connected to an output terminal of the low-side gate drive circuit, and a secondary side of the transformer is connected across a gate/source of the high-side switching element to generate a voltage of polarity opposite to that of primary side of the transformer. As a result, as the low-side gate drive circuit outputs a positive gate drive voltage, a negative voltage pulse is applied between the gate and source of the high-side switching element through the transformer, and the gate-to-source voltage becomes equal to or lower than a threshold value so that the high-side switching element maintains the turn-off state when the low-side switching element is turned on.

According to a second aspect, there is provided a gate drive circuit, in which a drain/source of a N-channel normally-on type switching element is connected across gates/sources of the switching elements, and a primary side of a transformer is connected to an output of the gate drive circuit. In addition, a secondary side of the transformer is connected across a gate/source of the N-channel normally-on type switching element such that a negative voltage pulse is applied between the gate and source of the N-channel normally-on type switching element when the gate drive circuit outputs a positive gate drive voltage. In addition, the high-side and low-side gate drive circuits is controlled such that the high-side gate drive circuit maintains 0 V or outputs a negative voltage when the low-side gate drive circuit outputs a positive voltage, and the high-side gate drive circuit outputs a positive voltage when the low-side gate drive circuit outputs 0 V or a negative voltage. When a positive voltage is output from the low-side gate drive circuit, and the low-side switching element is turned on, the gate-to-source voltage of the high-side N-channel normally-on type switching element outputs 0 V or a positive voltage and is turned on, so that the gate and source of the high-side switching element are short-circuited, and the high-side switching element maintains a turn-off state. Meanwhile, when a positive voltage is output from the high-side gate drive circuit, and the high-side switching element is turned on, the gate-to-source voltage of the low-side N-channel normally-on type switching element outputs 0 V or a positive voltage and is turned on, so that the gate and source of the low-side switching element are short-circuited, and the low-side switching element maintains a turn-off state.

According to a third aspect, there is provided a gate drive circuit, in which a drain/source of a P-channel normally-on type switching element is connected across gates/sources of the switching elements. In addition, the gate drive circuit of the P-channel normally-on type switching element is shared by the gate drive circuit of the switching elements. The high-side and low-side gate drive circuits are controlled such that the high-side gate drive circuit maintains 0 V or outputs a negative voltage when the low-side gate drive circuit outputs a positive voltage, and the high-side gate drive circuit outputs a positive voltage when the low-side gate drive circuit outputs 0 V or a negative voltage. When a positive voltage is output from the low-side gate drive circuit, and the low-side switching element is turned on, the high-side P-channel normally-on type switching element is turned on, so that the gate and source of the high-side switching element are short-circuited, and the high-side switching element maintains a turn-off state. Meanwhile, when the high-side switching element is turned on, the low-side P-channel normally-on type switching element is turned on, so that the gate and source of the low-side switching element are short-circuited, and the low-side switching element maintains a turn-off state.

Hereinafter, embodiments will be described with reference to the accompanying drawings.

First Embodiment

First, a gate drive circuit according to a first embodiment will be described.

Figure 3:
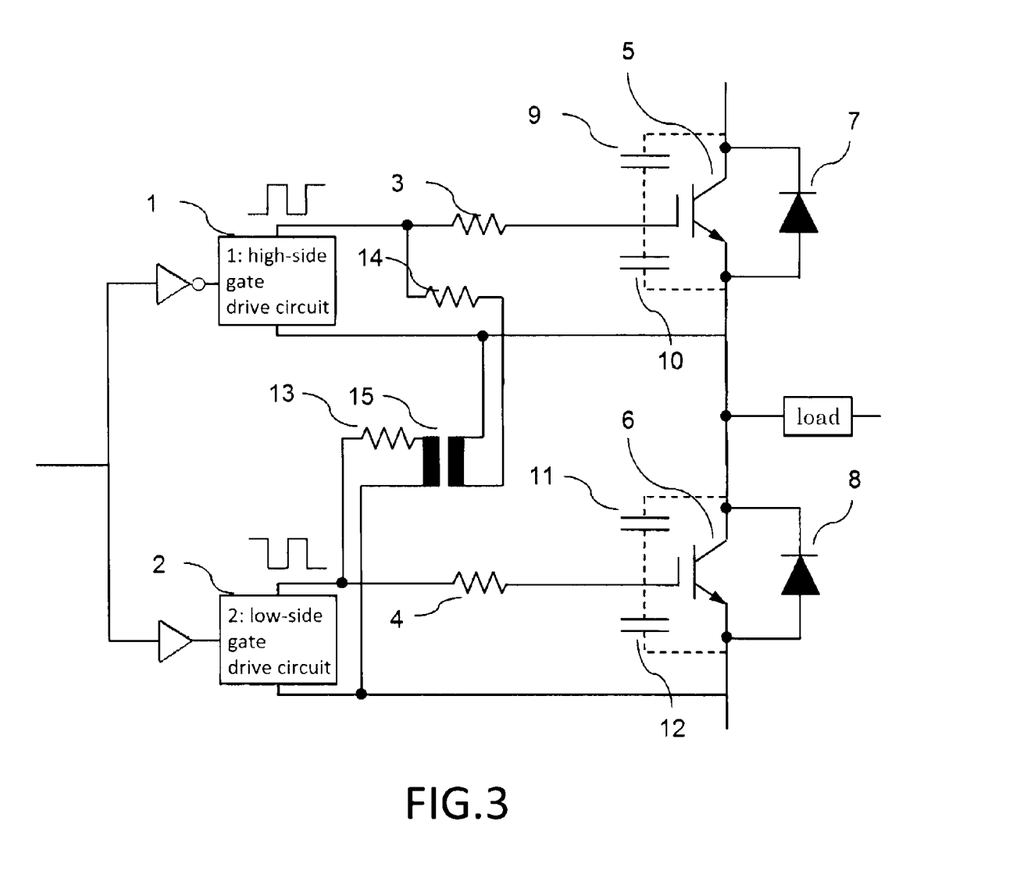
FIG. 3 is an equivalent circuit diagram illustrating a gate drive circuit according to a first embodiment.

FIG. 3 is an equivalent circuit diagram illustrating the gate drive circuit according to the first embodiment. The primary side of the transformer 15 is connected to the output terminal of the low-side gate drive circuit 2, and the secondary side of the transformer 15 is connected across the gate/source of the high-side switching element 5 to generate a voltage having a polarity opposite to that of the primary-side voltage of the transformer.

As a positive gate drive voltage is output from the low-side gate drive circuit 2, a negative voltage pulse is applied between the gate and source of the high-side switching element 5 through the transformer 15, and the gate-to-source voltage becomes equal to or lower than a threshold value so that the high-side switching element 5 maintains a turn-off state when the low-side switching element 6 is turned on.

Figure 4:
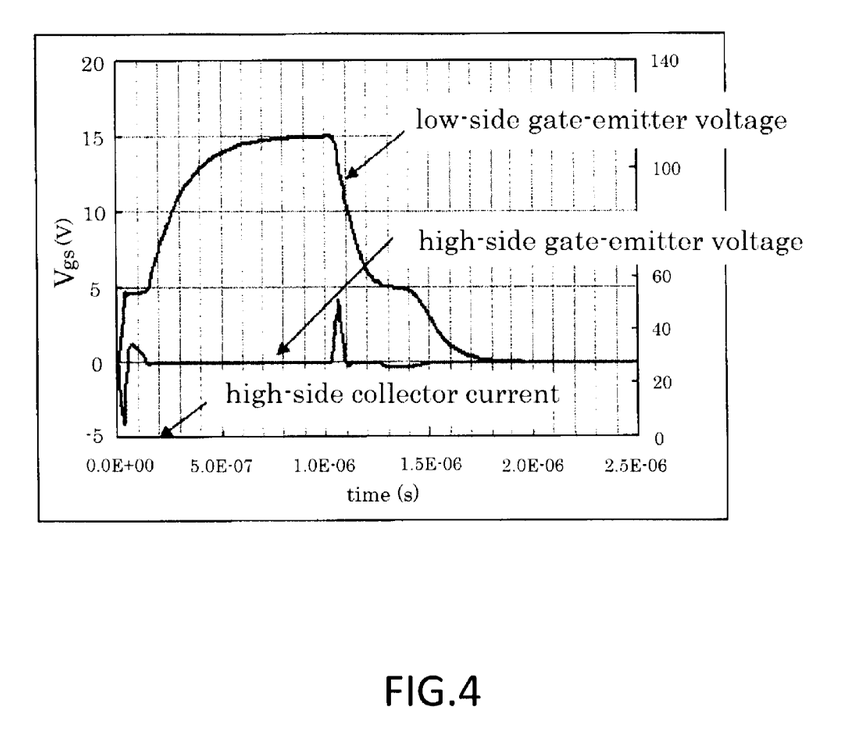
FIG. 4 is a simulation waveform diagram according to the first embodiment.

FIG. 4 illustrates a circuit simulation result of the gate drive circuit according to the first embodiment. While the low-side gate-to-emitter voltage rises from 0 V to 15 V, a negative pulse voltage is applied to the high-side gate-to-emitter voltage. In addition, since the high-side collector current does not flow, it is recognized that the high-side switching element maintains a turn-off state.

According to the first embodiment, it is possible to obtain advantageous effects in that the turn-off state of the switching element which is not turned on can be automatically maintained without adding an external control circuit for detecting various voltage/current states of the switching element which is turned on and feeding back this state to the gate drive side.

An air-core transformer is preferably used as the transformer according to the first embodiment. This is because a transformer having a magnetic material core suffers from hysteresis loss, and this does not contribute to reduction in loss. In addition, if the air-core transformer is used, it is relatively advantageous in terms of cost.

According to the first embodiment, it is preferable that the gate drive circuit output 0 V while the switching element is turned off, and output a positive voltage while the switching element is turned on.

The reason is as follows. That is, the first embodiment has been made to address a problem in that an erroneous operation may occur when the gate-to-source voltage exceeds a threshold value as the displacement current charges the gate-source capacitance. As a simple technique to prevent such a phenomenon, it may be possible to prevent the charge voltage from exceeding the threshold value by applying a negative bias (applying a negative voltage) between the gate and source when the switching element is turned off. In this case, since it is necessary to separately provide a negative power supply, the cost of the gate circuit disadvantageously increases. According to the first embodiment, since the negative power supply is not necessary, it is possible to reduce the cost of the electric power conversion apparatus.

Second Embodiment

Figure 5:
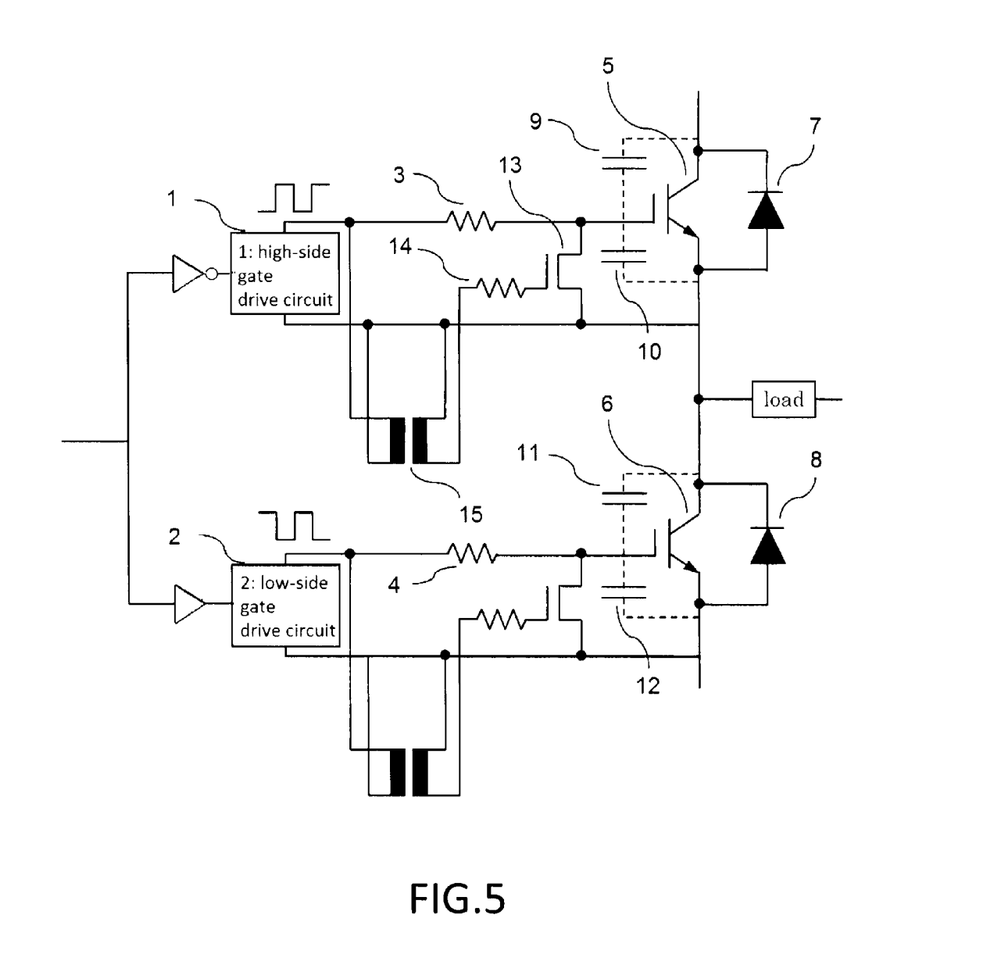
FIG. 5 is an equivalent circuit diagram illustrating a gate drive circuit according to a second embodiment.

FIG. 5 illustrates an equivalent circuit of the gate drive circuit according to a second embodiment. The drain/source of the N-channel normally-on type switching element 13 is connected across the gate/source of the high-side switching element 5, and the primary side of the transformer 15 is connected to the output of the high-side gate drive circuit 1. In addition, the secondary side of the transformer 15 is connected across the gate/source of the N-channel normally-on type switching element 13 such that a negative voltage pulse is applied between the gate and source of the N-channel normally-on type switching element 13 as a positive gate drive voltage is output from the high-side gate drive circuit 1. Since the configuration and operational principle of the low side are similar to those of the high side, redundant description thereof will not be repeated here.

The high-side gate drive circuit 1 and the low-side gate drive circuit 2 are controlled such that the high-side gate drive circuit 1 maintains 0 V or outputs a negative voltage when the low-side gate drive circuit 2 outputs a positive voltage, and the high-side gate drive circuit 1 outputs a positive voltage when the low-side gate drive circuit 2 outputs 0 V or a negative voltage.

When a positive voltage is output from the low-side gate drive circuit 2 to turn on the low-side switching element 6, the voltage between the gate and source of the N-channel normally-on type switching element 13 becomes 0 V or positive to be a turn-on state so that the gate and source of the high-side switching element 5 are short-circuited, and the high-side switching element 5 maintains a turn-off state.

According to the second embodiment, it is possible to obtain advantageous effects in that the turn-off state of the switching element which is not turned on can be automatically maintained without adding an external control circuit for detecting various voltage/current states of the switching element in the turn-on side and feeding back this state to the gate drive side. In addition, since the gate and source of the high-side switching element 5 are short-circuited even after the turn-on operation of the low-side switching element 6 is terminated, it is possible to obtain advantageous effects in that the high-side switching element 5 can maintain the turn-off state even when any noise is introduced from an external side.

As a transformer according to the second embodiment, an air-core transformer may be preferably employed. This is because a transformer having a magnetic material core suffers from hysteresis loss and does not contribute to reduction of loss.

Similar to the first embodiment described above, according the second embodiment, it is preferable that the gate drive circuit output 0 V when the switching element is turned off, and the gate drive circuit output a positive voltage when the switching element is turned on.

Third Embodiment

Figure 6:
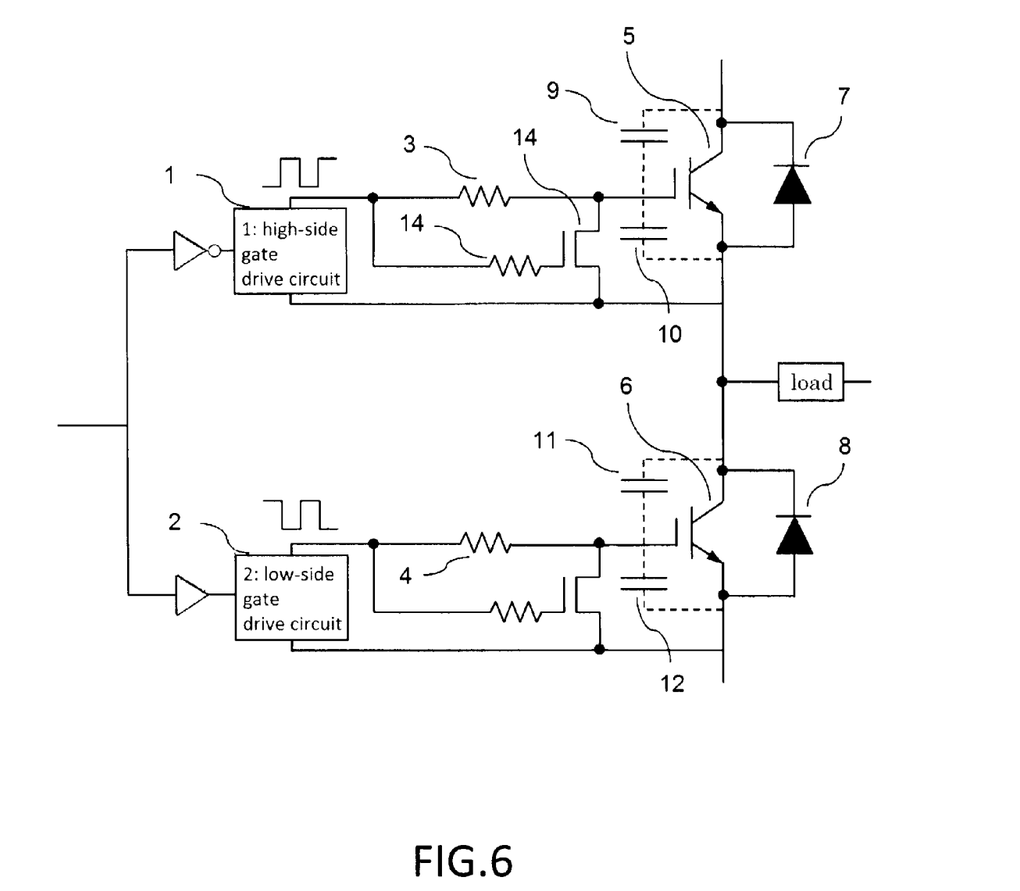
FIG. 6 is an equivalent circuit diagram illustrating a gate drive circuit according to a third embodiment.

FIG. 6 illustrates an equivalent circuit of the gate drive circuit according to a third embodiment. The drain/source of the P-channel normally-on type switching element 14 is connected across the gate/source of the high-side switching element 5 to drive the gate of the P-channel normally-on type switching element 14 using the high-side gate drive circuit 1. The configuration and operational principle of the low side are similar to those of the high side, and redundant description thereof will not be repeated here.

The high-side gate drive circuit 1 and the low-side gate drive circuit 2 are controlled such that the high-side gate drive circuit 1 maintains 0 V or outputs a negative voltage when the low-side gate drive circuit 2 outputs a positive voltage, and the high-side gate drive circuit 1 outputs a positive voltage when the low-side gate drive circuit 2 outputs 0 V or a negative voltage.

When a positive voltage is output from the low-side gate drive circuit 2 to turn on the low-side switching element 6, the gate-to-source voltage of the P-channel normally-on type switching element 14 becomes 0 V or a positive voltage to be a turn-on state, so that the gate and source of the high-side switching element 5 are short-circuited, and the high-side switching element 5 maintains a turn-off state.

According to the third embodiment, it is possible to obtain advantageous effects in that the turn-off state of the switching element which is not turned on can be automatically maintained without adding an external control circuit for detecting various voltage/current states of the switching element, particularly, which is turned on, and feeding back this state to the gate drive side. In addition, since the gate and source of the high-side switching element 5 are short-circuited even after the turn-on operation of the low-side switching element 6 is terminated, it is possible to have advantageous effects in that the high-side switching element 5 can maintain the turn-off state even when any noise is introduced from an external side.

Similar to the first embodiment described above, according the third embodiment, it is preferable that the gate drive circuit output 0 V when the switching element is turned off, and the gate drive circuit output a positive voltage when the switching element is turned on.

Although the first to third embodiments have been described hereinbefore, in this configuration, it is possible to realize a gate drive circuit having a circuit for maintaining the gate-to-source (or gate-to-emitter) voltage of the switching element to be equal to or lower than a threshold value with a small number of components and a simple and easy circuit configuration.

Semiconductor Element Chip, Module, and Package

Although a drive circuit has been described in each of the aforementioned embodiments, the drive circuit according to an embodiment preferably has a wiring length as short as possible in order to prevent delayed pulse output, waveform deformation, and increased wiring resistance. It is preferable that elements that can be formed on a single semiconductor chip be collectively formed on the same IC chip. In addition, it is preferable that the elements be encapsulated in a single package as a module.

More specifically, in the aforementioned gate drive circuit, the transformer may be encapsulated in a single package together with the low-side gate drive circuit, the high-side gate drive circuit, the N-channel normally-on type switching element, or the P-channel normally-on type switching element as a gate drive IC. In addition, the N-channel normally-on type switching element or the P-channel normally-on type switching element may be integrated into a single semiconductor chip together with a main switching element as the switching element.

Furthermore, the high-side gate drive circuit, the low-side gate drive circuit, transformer, the high-side main switching element, and the low-side main switching element may be encapsulated in a single package as a power semiconductor module.

Alternatively, the high-side gate drive circuit, the low-side gate drive circuit, the transformer, the N-channel normally-on type switching element, the high-side main switching element, and the low-side main switching element may be encapsulated in a single package as a power semiconductor module.

Alternatively, the high-side gate drive circuit, the low-side gate drive circuit, the P-channel normally-on type switching element, the high-side main switching element, and the low-side main switching element may be encapsulated in a single package as a power semiconductor module.

Through the aforementioned modularization and packaging, the following effects are anticipated: that is, (1) for circuit technicians, a connection work of the air-core transformer is not necessary; (2) circuit technicians can employ components having optimal characteristics such as a power semiconductor module by combining the air-core transformer having an optimal parameter suitable for parameters of various power semiconductors (switching elements); and (3) characteristics of the power semiconductor chip and the air-core transformer are improved.

Although several embodiments have been described hereinbefore, those embodiments are just for exemplary purposes and are not intended to limit the scope of the invention. Those novel embodiments may be embodied in various other forms, and various omissions, substitutions, or changes may be made without departing from the spirit and scope of the invention. Such embodiments or modifications are to be construed in the broadest sense within the spirit or scope of the invention, and incorporated into the invention disclosed in the claims and equivalents thereof.

While certain embodiments have been described, these embodiments have been presented by way of example only, and are note intended to limit the scope of the inventions. Indeed, the novel circuits described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A gate drive circuit in a power conversion circuit, the gate drive circuit comprising:
   two switching elements connected in series,
   wherein one of the switching elements having a higher electric potential with respect to a connection point is used as a high-side switching element, a low-side switching element having a lower electric potential with respect to the connection point is used as a low-side switching element, the high-side and low-side gate drive circuits being controlled such that the high-side gate drive circuit maintains 0 V or outputs a negative voltage when the low-side gate drive circuit outputs a positive voltage, and the high-side gate drive circuit outputs a positive voltage when the low-side gate drive circuit outputs 0 V or a negative voltage, and
   a primary side of a transformer is connected to an output terminal of the low-side gate drive circuit, and a secondary side of the transformer is connected across a gate/source of the high-side switching element to generate a voltage of a polarity opposite to that of primary side of the transformer,
   wherein the transformer is an air-core transformer.

2. The gate drive circuit according to claim 1, wherein the gate drive circuit outputs 0 V or a positive voltage.

3. A gate drive circuit in a power conversion circuit, the gate drive circuit comprising:
   two switching elements connected in series,
   wherein one of the switching elements having a higher electric potential with respect to a connection point is used as a high-side switching element, and the other switching element having a lower electric potential with respect to the connection point is used as a low-side switching element, the high-side and low-side gate drive circuits being controlled such that the high-side gate drive circuit maintains 0 V or outputs a negative voltage when the low-side gate drive circuit outputs a positive voltage, and the high-side gate drive circuit outputs a positive voltage when the low-side gate drive circuit outputs 0 V or a negative voltage, and
   a drain/source of a N-channel normally-on type auxiliary switching element is connected across gates/sources of the high-side and low-side switching elements, a primary side of a transformer is connected to an output of the gate drive circuit, and a secondary side of the transformer is connected across a gate/source of the N-channel normally-on type switching element such that a negative voltage pulse is applied between the gate and source of the N-channel normally-on type switching element when the gate drive circuit outputs a positive gate drive voltage,
   wherein the transformer is an air-core transformer.

4. The gate drive circuit according to claim 3, wherein the gate drive circuit outputs 0 V or a positive voltage.

5. A gate drive circuit in a power conversion circuit, the gate drive circuit comprising:
   two switching elements connected in series,
   wherein one of the switching elements having a higher electric potential with respect to a connection point is used as a high-side switching element, and the other switching element having a lower electric potential with respect to the connection point is used as a low-side switching element, the high-side and low-side gate drive circuits being controlled such that the high-side gate drive circuit maintains 0 V or outputs a negative voltage when the low-side gate drive circuit outputs a positive voltage, and the high-side gate drive circuit outputs a positive voltage when the low-side gate drive circuit outputs 0 V or a negative voltage, and
   a drain/source of a P-channel normally-on type auxiliary switching element is connected across gates/sources of the high-side and low-side switching elements, and, when any one of the low-side or high-side gate drive circuit outputs a positive voltage to turn on a main switching element, the P-channel normally-on type auxiliary switching element connected to one of main switching elements is turned on, so that the gate and source of the main switching element are short-circuited, and the main switching element maintains a turn-off state.

6. The gate drive circuit according to claim 5, wherein the gate drive circuit outputs 0 V or a positive voltage.

7. A power semiconductor module obtained by encapsulating the high-side gate drive circuit, the low-side gate drive circuit, the transformer, the high-side main switching element, and the low-side main switching element of the gate drive circuit according to claim 1 into a single package.

8. A power semiconductor module obtained by encapsulating the high-side gate drive circuit, the low-side gate drive circuit, the transformer, the N-channel normally-on type switching element, the high-side main switching element, and the low-side main switching element of the gate drive circuit according to claim 3 into a single package.

9. A power semiconductor module obtained by encapsulating the high-side gate drive circuit, the low-side gate drive circuit, the P-channel normally-on type switching element, the high-side main switching element, and the low-side main switching element of the gate drive circuit according to claim 5 into a single package.

* * * * *